(12) United States Patent
Henckens et al.

(10) Patent No.: US 9,914,855 B2
(45) Date of Patent: Mar. 13, 2018

(54) CURABLE COMPOSITIONS COMPRISING COMPOSITE PARTICLES

(71) Applicant: HENKEL AG & CO. KGAA, Duesseldorf (DE)

(72) Inventors: Anja Henckens, Zonhoven (BE); Nabila Idrissi, Westerlo (BE)

(73) Assignee: HENKEL AG & CO. KGAA, Duesseldorf (DE)

( * ) Notice: Subject to any disclaimer, the term of this patent is extended or adjusted under 35 U.S.C. 154(b) by 0 days.

(21) Appl. No.: 14/620,576

(22) Filed: Feb. 12, 2015

(65) Prior Publication Data

US 2015/0159057 A1 Jun. 11, 2015

Related U.S. Application Data

(63) Continuation of application No. PCT/EP2013/066641, filed on Aug. 8, 2013.

(30) Foreign Application Priority Data

Aug. 14, 2012 (GB) .................................. 1214504.1

(51) Int. Cl.

| | | |
|---|---|---|
| *C09J 9/02* | (2006.01) | |
| *C09J 5/06* | (2006.01) | |
| *C09J 11/04* | (2006.01) | |
| *H05K 3/32* | (2006.01) | |
| *C09J 163/00* | (2006.01) | |
| *B32B 37/12* | (2006.01) | |
| *B32B 37/18* | (2006.01) | |
| *C09J 133/00* | (2006.01) | |
| *C08K 3/08* | (2006.01) | |
| *C08K 3/10* | (2018.01) | |
| *H01R 4/04* | (2006.01) | |
| *H05K 1/05* | (2006.01) | |
| *H05K 3/36* | (2006.01) | |

(52) U.S. Cl.
CPC ............. *C09J 9/02* (2013.01); *B32B 37/1284* (2013.01); *B32B 37/18* (2013.01); *C09J 5/06* (2013.01); *C09J 11/04* (2013.01); *C09J 133/00* (2013.01); *C09J 163/00* (2013.01); *H05K 3/321* (2013.01); *C08K 3/08* (2013.01); *C08K 3/10* (2013.01); *C09J 2203/322* (2013.01); *C09J 2400/163* (2013.01); *C09J 2433/00* (2013.01); *H01R 4/04* (2013.01); *H05K 1/053* (2013.01); *H05K 3/368* (2013.01); *H05K 2201/0218* (2013.01); *H05K 2201/0272* (2013.01)

(58) Field of Classification Search
None
See application file for complete search history.

(56) References Cited

U.S. PATENT DOCUMENTS

| | | | | |
|---|---|---|---|---|
| 3,867,351 | A | * | 2/1975 | Juna ........................ C08F 28/00 522/171 |
| 5,175,056 | A | | 12/1992 | Walther et al. |
| 5,399,432 | A | * | 3/1995 | Schleifstein ............. B05D 5/12 252/512 |
| 5,750,249 | A | | 5/1998 | Walther et al. |
| 8,815,983 | B2 | * | 8/2014 | Gerk ........................ B22F 1/02 523/210 |
| 2002/0193467 | A1 | | 12/2002 | Cheng et al. |
| 2008/0216887 | A1 | | 9/2008 | Hacke et al. |
| 2008/0292801 | A1 | | 11/2008 | Shah et al. |
| 2010/0090176 | A1 | * | 4/2010 | Kosowsky ............... H01B 1/20 252/511 |
| 2010/0110608 | A1 | * | 5/2010 | Wei ..................... C04B 35/4682 361/321.4 |
| 2012/0037223 | A1 | * | 2/2012 | Yamanaka ............... H01B 1/22 136/256 |
| 2012/0126183 | A1 | * | 5/2012 | Hosoi ...................... H01B 1/02 252/514 |
| 2012/0177930 | A1 | * | 7/2012 | Henckens .................. C09J 9/02 428/414 |

FOREIGN PATENT DOCUMENTS

| | | | |
|---|---|---|---|
| EP | 2211354 | A1 | 7/2010 |
| GB | 2248450 | A | 4/1992 |
| JP | 62164776 | A | 7/1987 |
| JP | 3250068 | A | 11/1991 |
| JP | 1079570 | A | 3/1998 |
| WO | WO 2011/124542 | * | 10/2011 |
| WO | 2012124724 | A1 | 9/2012 |

* cited by examiner

*Primary Examiner* — Robert C Boyle
(74) *Attorney, Agent, or Firm* — James J. Cummings

(57) ABSTRACT

The present invention relates to curable compositions that are suitable for use as electrically conductive materials in the fabrication of electronic devices, integrated circuits, semiconductor devices, passive components, solar cells, solar modules, and/or light emitting diodes. The curable compositions comprise a) one or more curable resins; b) composite particles, which comprise i) an electrically conductive core, and ii) an electrically conductive shell, comprising one or more shell materials each selected from the group consisting of metal carbides, metal sulfides, metal borides, metal silicides, and metal nitrides; and c) electrically conductive particles different from component b). The present invention further relates to a method of bonding a first substrate to a second substrate, wherein the substrates are bonded under heat and pressure using said curable composition.

17 Claims, No Drawings

CURABLE COMPOSITIONS COMPRISING COMPOSITE PARTICLES

FIELD OF THE INVENTION

The present invention relates to curable compositions that are suitable for use as electrically conductive materials in the fabrication of electronic devices, integrated circuits, semiconductor devices, passive components, solar cells, solar modules, and/or light emitting diodes. The curable compositions comprise a) one or more curable resins; b) composite particles which comprise i) an electrically conductive core, and ii) an electrically conductive shell, comprising one or more shell materials each selected from the group consisting of metal carbides, metal sulfides, metal borides, metal silicides, and metal nitrides; and c) electrically conductive particles different from component b). The present invention further relates to a method of bonding a first substrate to a second substrate, wherein the substrates are bonded under heat and pressure using said curable composition.

BACKGROUND OF THE INVENTION

Electrically conductive materials are used for a variety of purposes in the fabrication and assembly of electronic devices, integrated circuits, semiconductor devices, passive components, solar cells, solar modules, and/or light emitting diodes.

For example electrically conductive materials, such as electrically conductive adhesives (ECAs) can be used to bond metallic electrodes to conductive surfaces to form an assembly. These assemblies, however, are vulnerable to environmental conditions, because high temperature and high humidity can cause the electrical contact resistance of the assemblies to increase substantially over time. The suspected mode of failure is electrochemical corrosion due to the formation of a galvanic cell in the presence of moisture, especially when the electrically conductive materials contain noble metals, such as silver, which have a higher electrochemical potential than the surrounding electrodes.

U.S. Publication No. 2002 0193467 A1 teaches one possible solution to improve the stability of the contact resistance over time. The disclosed electrically conductive materials comprise an effective amount of corrosion inhibitors to inhibit or reduce the surface corrosion. As corrosion inhibitors could affect the chemical or physical properties of an electrically conductive material it would be desirable to provide alternative formulations where a similar performance is achieved without using any corrosion inhibitor or where only a reduced amount of these materials is used.

Hence, there is a need for new curable compositions suitable for use as electrically conductive materials that are easy to handle and that exhibit a stable and low contact resistance even when these materials are used to form electrically conductive bonds between oxidizable substrates, which are exposed to harsh environmental conditions. Additionally it would be desirable to achieve the stable and low contact resistance without using any corrosion inhibitors or by using only a reduced amount of corrosion inhibitors.

SUMMARY OF THE INVENTION

The present invention provides a curable composition which is capable of forming electrically conductive bonds between different substrates, wherein the electrical contact resistance of said bonds is low and relatively stable even when being exposed to harsh environmental conditions, such as heat and/or moisture. It is a particular advantage of the curable composition of the present invention that said composition can be used to generate electrically conductive bonds between highly oxidized substrates, such as aluminum substrates which exhibit an aluminum oxide surface layer, wherein said bonds exhibit a stable and low contact resistance over a long period of time.

DETAILED DESCRIPTION OF THE INVENTION

The curable composition of the present invention comprises:
  a) one or more curable resins;
  b) composite particles, comprising
    i) an electrically conductive core, and
    ii) an electrically conductive shell, comprising one or more shell materials each selected from the group consisting of metal carbides, metal sulfides, metal borides, metal silicides, and metal nitrides;
  c) electrically conductive particles different from component b).

The term "curable resin" as used herein, refers to any precursor which is not fully cured and/or crosslinked, e.g., which is capable of being further cured and/or crosslinked using, e.g., (radical) polymerization, polycondensation and/or polyaddition reactions. Curable resin suitable for use in the present invention include monomers, oligomers or prepolymers which are preferably in a liquid form at 22° C. or which may be melted at relatively low temperatures, for example, below 100° C., to form liquids.

The term "composite particle", as used herein, refers to a particulate material which exhibits a core-shell structure.

The term "electrically conductive", as used herein, means that a material is capable of passing an electric current through the material.

The curable resin used in the curable composition of the present invention may be selected from epoxy resins, phenoxy resins, benzoxazine resins, acrylic resins, maleimide resins, cyanate ester resins, phenolic resins, silicone resins, and/or any combination thereof. To optimize the properties of the curable composition it may be desirable to use mixtures of two or more different curable resins, such as mixtures of different epoxy resins, mixtures of different acrylic resins or mixtures of resins of different chemistries.

The curable resin(s) may be present in a total amount of about 2 to about 40 wt.-%, preferably in a total amount of about 3 to about 25 wt.-%, and more preferably in a total amount of about 4 to about 20 wt.-%, each based on the total weight of the curable composition of the present invention. The term "total amount", as used above, refers to sum of the amounts of all curable resin components present in the curable composition of the present invention.

In one embodiment of the present invention the curable resin is selected from acrylic resins. Suitable acrylic resins include compounds having one, two, three or more polymerizable acryloyl group(s).

The term "acryloyl group", as used herein, refers to a functional group having the structure:

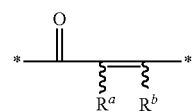

wherein $R^a$ and $R^b$ are each independently selected from hydrogen or $C_{1-12}$ alkyl, such as methyl, and wherein $R^a$ and $R^b$ may be disposed either cis or trans about the carbon-carbon double bond. Preferably, $R^a$ and $R^b$ are each independently hydrogen or methyl.

In a particular preferred embodiment the curable resin comprises at least one acrylic resin selected from monofunctional acrylic esters, preferably selected from acrylic esters of formula (I),

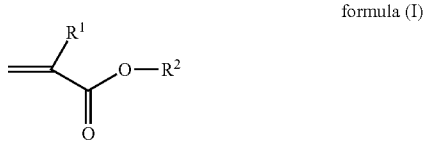

formula (I)

wherein $R^1$ represents hydrogen or $C_{1-12}$ alkyl, such as methyl, and $R^2$ is selected from alkyl, cycloalkyl, alkenyl, cycloalkenyl, alkaryl, aralkyl or aryl groups any of which may be optionally substituted or interrupted as the case may be with silane, silicon, oxygen, halogen, carbonyl, ester, carboxylic acid, urea, urethane, carbonate, amine, amide, sulfur, sulfonate, sulfone and the like.

The term "monofunctional", as used herein, refers to acrylic resins which comprise one acryloyl group per molecule.

To improve the moisture barrier properties of the curable composition of the present invention the acrylic resin may comprise at least one hydrophobic acrylic resin.

The term "hydrophobic" as used in the present invention refers to compounds which exhibit a water solubility of less than 1.0 g, preferably less than 0.8 g, and more preferably less than 0.7 g in 100 g of deionized water (ASTM D1193-91, type IV) at 22° C. and pH 7.

Examples of specific suitable hydrophobic acrylic resins for use herein include isobornyl(meth)acrylate, tetrahydrofurfuryl(meth)acrylate, cyclohexyl(meth)acrylate, t-butyl cyclohexyl(meth)acrylate, trimethyl cyclohexyl(meth)acrylate or mixtures thereof.

Other examples of specific suitable hydrophobic acrylic resins for use herein include (meth)acrylated polyisobutadiene resins, (meth)acrylated polyisoprene resins, such as UC102, UC105 and UC203 from Kuraray Co., Ltd.

Further suitable acrylic resins may be selected from hydroxyl-functional acrylic resins, acryloyl-containing polyurethanes, or alkoxylated acryloyl compounds.

Examples of specific suitable hydroxyl-functional acrylic resins for use herein include 2-hydroxyethyl(meth)acrylate, 3-hydroxypropyl(meth)acrylate, 4-hydroxybutyl(meth)acrylate, or mixtures thereof.

Examples of specific suitable alkoxylated acryloyl compounds include (ethoxylated)$_{2-40}$ 1,6-hexanediol di(meth)acrylate, (propoxylated)$_{2-40}$ 1,6-hexanediol di(meth)acrylate, (ethoxylated)$_{2-40}$ 1,4-butanediol di(meth)acrylate, (propoxylated)$_{2-40}$ 1,4-butanediol di(meth)acrylate, (ethoxylated)$_{2-40}$ 1,3-butanediol di(meth)acrylate, (propoxylated)$_{2-40}$ 1,3-butanediol di(meth)acrylate, (ethoxylated)$_{2-40}$ ethylene glycol di(meth)acrylate or mixtures thereof.

For specific applications it may be desirable to further improve the stability of the electrical contact resistance of the curable composition of the present invention while maintaining good moisture barrier properties. In these cases the curable composition of the present invention may further comprise at least one phosphorous-containing acrylic resin. The term "phosphorous-containing", as used herein, refers to acrylic resins which comprise at least one phosphorous atom, e.g. in form of a phosphate ester, which may be partially hydrolyzed.

Suitable phosphorous-containing acrylic resins may be selected from phosphate monoesters of hydroxyalkyl (meth)acrylates, phosphate diesters of hydroxyalkyl (meth)acrylates, phosphate triesters of hydroxyalkyl (meth)acrylates or mixtures thereof.

Specific suitable phosphorous-containing acrylic resins may be selected from 2-hydroxyethyl (meth)acrylate phosphate monoester, 3-hydroxypropyl (meth)acrylate monoester, 4-hydroxybutyl (meth)acrylate monoester, di-[2-hydroxyethyl (meth)acrylate] phosphate ester, di-[3-hydroxypropyl (meth)acrylate] phosphate ester, di-[4-hydroxybutyl (meth)acrylate] phosphate ester, tri-[2-hydroxyethyl (meth)acrylate] phosphate ester, tri-[3-hydroxypropyl (meth)acrylate] phosphate ester, tri-[4-hydroxybutyl (meth)acrylate] phosphate ester, or mixtures thereof. Also phosphate di- or triesters of different hydroxyalkyl (meth)acrylates are suitable for use herein.

Commercially available phosphorous-containing acrylic resins suitable for use in the present invention are e.g. those available under the tradenames SR9051 and SR9054 from Sartomer; PAM100, PAM200 and PAM4000 from Rhodia; Genorad 40 from Rahn USA Corp.; and Ebecryl 168, 170 and 171 from Cytec Industries Inc.

It will be understood that the suffix (meth)acryl, as used herein, denotes either acryl- or methacryl-.

In cases where the curable resin is selected from acrylic resins it is preferred that these acrylic resin(s) is/are present in a total amount of about 2 to about 30 wt.-%, preferably in a total amount of about 3 to about 20 wt.-%, and more preferably in a total amount of about 4 to about 15 wt.-%, each based on the total weight of the curable composition of the present invention.

In another embodiment of the present invention the curable resin is selected from epoxy resins.

Suitable epoxy resins may include multifunctional epoxy-containing compounds, such as glycidyl ethers of $C_2$-$C_{28}$ diols, $C_1$-$C_{28}$ alkyl- or poly-phenol glycidyl ethers; polyglycidyl ethers of pyrocatechol, resorcinol, hydroquinone, 4,4'-dihydroxydiphenyl methane (or bisphenol F, such as RE-303-S or RE-404-S available commercially from Nippon Kayuku, Japan), 4,4'-dihydroxy-3,3'-dimethyldiphenyl methane, 4,4'-dihydroxydiphenyl dimethyl methane (or bisphenol A), 4,4'-dihydroxydiphenyl methyl methane, 4,4'-dihydroxydiphenyl cyclohexane, 4,4'-dihydroxy-3,3'-dimethyldiphenyl propane, 4,4'-dihydroxydiphenyl sulfone, and tris(4-hydroxyphenyl) methane; polyglycidyl ethers of transition metal complexes; chlorination and bromination products of the above-mentioned diphenols; polyglycidyl ethers of novolacs; polyglycidyl ethers of diphenols obtained by esterifying ethers of diphenols obtained by esterifying salts of an aromatic hydrocarboxylic acid with a dihaloalkane or dihalogen dialkyl ether; polyglycidyl ethers of polyphenols obtained by condensing phenols and long-chain halogen paraffins containing at least two halogen atoms; phenol novolac epoxy; cresol novolac epoxy; and combinations thereof.

Among the commercially available epoxy resins suitable for use in the present invention are epoxy silicone copolymers, such as those available under the tradenames Albifelx 296, Albiflex 348 and Albiflex 712 from Hanse Chemie, polyglycidyl derivatives of phenolic compounds, such as those available under the tradenames EPON 825, EPON 826, EPON 828, EPON 1001, EPON 1007 and EPON 1009 from Huntsman, Epiclon EXA 830 CRP, Epiclon EXA 850

CRP, Epiclon EXA 835 LVP from DIC, Epalloy 5000, Epalloy 5001, from CVC Chemicals, cycloaliphatic epoxy-containing compounds such as Araldite CY179 from Huntsman, Epalloy 5200 from CVC Chemicals or Celloxide 2021 P from Daicel or waterborne dispersions under the tradenames EPI-REZ 3510, EPI-REZ 3515, EPI-REZ 3520, EPI-REZ 3522, EPI-REZ 3540 or EPI-REZ 3546 from Hexion; DER 331, DER 332, DER 383, DER 354, and DER 542 from Dow Chemical Co.; GY285 from Huntsman, Inc.; and BREN-S from Nippon Kayaku, Japan. Other suitable epoxy-containing compounds include polyepoxides prepared from polyols and the like and polyglycidyl derivatives of phenol-formaldehyde novolacs, the latter of which are available commercially under the tradenames DEN 431, DEN 438, and DEN 439 from Dow Chemical Company, Epiclon N-740, Epiclon N-770, Epiclon N-775 from DIC and a waterborne dispersion ARALDITE PZ 323 from Huntsman.

Cresol analogs are also available commercially such as ECN 1273, ECN 1280, ECN 1285, and ECN 1299 or Epiclon N-660, Epiclon N-665, Epiclon N-670, Epiclon N-673, Epiclon N-680, Epiclon N-695 from DIC or waterborne dispersions ARALDITE ECN 1400 from Huntsman, Inc. SU-8 and EPI-REZ 5003 are bisphenol A-type epoxy novolacs available from Hexion.

Of course, combinations of different epoxy resins are also desirable for use herein.

In cases where the curable resin is selected from epoxy resin it is preferred that these epoxy resin(s) is/are present in a total amount of about 2 to about 40 wt.-%, preferably in a total amount of about 3 to about 30 wt.-%, and more preferably in a total amount of about 4 to about 25 wt.-%, each based on the total weight of the curable composition of the present invention.

As noted above, the curable composition of the present invention further comprises composite particles which encompass i) an electrically conductive core, and ii) an electrically conductive shell, comprising one or more shell materials each selected from the group consisting of metal carbides, metal sulfides, metal borides, metal silicides, and metal nitrides. In order to optimize the properties of the curable composition for specific applications it may be desirable to use mixtures of two or more different composite particles.

The electrically conductive core can be chosen from a wide range of alternatives, depending upon which one accommodates the contemplated application. The electrically conductive core is advantageously in particulate form. In some embodiments the electrically conductive core is substantially spheroidal, for instance spherical, but in other embodiments the electrically conductive core can also have an irregular shape.

The electrically conductive core may comprise one or more core materials, each independently selected from metals, metal oxides, metal alloys, or combinations thereof.

Advantageously, the core material can be aluminum, tin, zinc, nickel, cadmium, indium or magnesium. It is further on preferred to adapt the electrochemical potential of the core material to the electrochemical potential of surrounding metallic surfaces, in cases where the curable composition of the present invention is used in the bonding or coating of metallic surfaces. For example it is desirable to use aluminum as the core material of the composite particles when the curable composition of the present invention is used to bond or coat aluminum surfaces.

Other metals can be used, as well as metal alloys such as tin/antimony alloy, so long as these core materials are electrically conductive. It will be appreciated that some of the aforementioned metals or metal alloys typically form oxides when being in contact with oxygen, and thus naturally carry an oxide layer. For, example in the case where the core material is aluminum, the oxide layer is aluminum oxide or a hydrate of aluminum oxide.

To reduce the oxidation of the core material it may be desirable to interpose a noble metal or noble metal alloy between the electrically conductive core and the electrically conductive shell, wherein said noble metal or noble metal alloy is different from the core and shell material(s). Typically, the noble metal utilized is silver or gold, but other noble metals, for instance, platinum or palladium can be used. Also, noble metal alloys, such as alloys of two or more noble metals, or alloys of one or more noble metals with one or more other metals can be utilized. Examples of the alloys include alloys of noble metals which have comparable resistivities to the noble metals themselves. Preferably, the noble metal or noble metal alloy is incorporated in the composite particle in an amount of from about 2 wt.-% to about 8 wt.-% and more preferably from about 2 wt.-% to about 5 wt.-%, each based on the total amount of the composite particles.

In other embodiments, the electrically conductive core comprises or consist of an inert particulate material coated with one or more metals or metal alloys. For instance, the electrically conductive core can comprise or consist of one or more glasses, such as soda lime glass, borosilicate glass, glass fibers or hollow glass microspheres, as well as ceramic substances such as alundum, and mica and other minerals, wherein all theses materials are coated with one or more metals or metal alloys, such as aluminum and/or silver.

In the composite particles used in the curable composition of the present invention the core material may be present in an amount of about 10 wt.-% to about 99.5 wt.-%, preferably in an amount of about 30 wt.-% to about 95 wt.-%, and more preferably in an amount of about 60 wt.-% to about 90 wt.-%, each based on the total amount of the composite particle.

The composite particles used in the curable composition of the present invention further comprise an electrically conductive shell wherein the conductive shell comprises one or more shell materials each selected from the group consisting of metal carbides, metal sulfides, metal borides, metal silicides, and metal nitrides. The electrically conductive shell can comprise any combination of different shell materials, for example two or more different metal carbides or mixtures of shell materials of different substance classes, e.g. mixtures of metal carbide(s) with metal nitride(s).

In certain advantageous embodiments, the shell material has a hardness which is greater than the hardness of the core material. In certain other advantageous embodiments, such as where the oxide layer of the core material is particularly thick, the shell material can be harder than the oxide layer. Preferably, the hardness of the core material is on the order of about 1 to 6 Mohs. The hardness of the shell material is preferably above 7 Mohs, more preferably above 8 Mohs, and particularly preferably above 9 Mohs.

Typical suitable metal sulfides are copper sulfide, silver sulfide, iron sulfide, nickel sulfide, cobalt sulfide, lead sulfide and zinc sulfide. Typical suitable metal silicides are chromium silicide, molybdenum silicide, cobalt silicide, vanadium silicide, tungsten silicide and titanium silicide. Typical metal borides are chromium boride, molybdenum boride, titanium boride, zirconium boride, niobium boride and tantalum boride. Typical metal nitrides are tantalum nitride, titanium nitride, vanadium nitride and zirconium nitride. NbB, NbB$_2$, TiN, VSi$_2$, MoB, TiB$_2$, ZrB$_2$, B$_4$C, ZrN, CoSi$_2$ and MoSi$_2$ are especially preferred.

A particularly low contact resistance can be obtained when the shell material is a metal carbide selected from tungsten carbide, niobium carbide, titanium carbide, vanadium carbide, molybdenum carbide, zirconium carbide or boron carbide. Tungsten carbide (WC) is especially preferred for use herein.

In certain advantageous embodiments, the core material and shell material are conductively fused by configuring the composite particle such that shell material provides a conductive path through the oxide layer of the core material to the core material itself. Typically, the shell material breaches the oxide layer so as to make contact with the core material (either directly or through noble metal or noble metal alloy remaining between the refractory material and the core material) and extend outwardly from the oxide layer. Thus, an electrical current can be conducted through the oxide layer to the core material via the shell material.

In the composite particles used in the curable composition of the present invention the shell material may be present in an amount of about 0.5 wt.-% to about 90 wt.-%, preferably in an amount of about 5 wt.-% to about 70 wt.-%, and more preferably in an amount of about 10 wt.-% to about 40 wt.-%, each based on the total amount of the composite particle.

Preferably, the composite particles used in the curable composition of the present invention have an average particle size of about 100 nm to about 100 μm, preferably of about 1 μm to about 90 μm, more preferably of about 5 μm to about 80 μm, and particularly preferably of about 10 μm to about 70 μm.

As used in the present invention, the term "average particle size" refers to the D50 value of the cumulative volume distribution curve at which 50% by volume of the particles have a diameter less than said value. The volume average particle size or D50 value is measured in the present invention through laser diffractometry, preferably using a Malvern Mastersizer 2000 available from Malvern Instruments Ltd. In this technique, the size of particles in suspensions or emulsions is measured using the diffraction of a laser beam, based on application of either Fraunhofer or Mie theory. In the present invention, Mie theory or a modified Mie theory for non-spherical particles is applied and the average particle sizes or D50 values relate to scattering measurements at an angle from 0.02 to 135 degrees relative to the incident laser beam. For the measurement it is further on preferred that a dispersion of the particles in a suitable liquid, such as acetone, is prepared by using ultrasonication. In order to produce an acceptable signal-to-noise ratio the particle concentration in the dispersion should preferably be chosen in a way that an obscuration between 6% to 20% is obtained.

Preferred composite particles include the following, wherein the shell material is listed first with the core material(s) following the slash: CoSi$_2$/Al, TiN/Al, VSi$_2$/Al, NbB/Al, NbB/Sn, WC/Sn, WC/Al.

WC/Al composite particles which have an electrically conductive aluminum core and an electrically conductive shell of tungsten carbide are particularly preferred for use herein.

The composite particles may be present in the curable composition in an amount of about 5 wt.-% to about 85 wt.-%, preferably in an amount of about 20 wt.-% to about 70 wt.-%, and more preferably in an amount of about 30 wt.-% to about 50 wt.-%, each based on the total amount of the curable composition of the present invention.

Suitable composite particles are presently available commercially under the tradenames Galvan-o-free GF-25, GF-45 and GF-60 from Potters Industries Inc.

The composite particles used in the present invention can be prepared by any suitable method known to those skilled in the art, for example by atomizing and further treating a molten mixture of one or more core materials and one or more shell materials, vapor deposition, wet chemical conversion and electroless plating. Such methods are described, e.g., in U.S. Pat. Nos. 5,175,056, 5,399,432, and 5,750,249.

The curable composition of the present invention further comprises electrically conductive particles which are different from the composite particles described above. In order to optimize the properties of the curable composition for specific applications it may be desirable to use mixtures of two or more different electrically conductive particles.

The term "electrically conductive particles", as used herein, refers to any particulate material, which when added to a non-conductive resin component increases the electrical conductivity of the formed polymer composite. The electrically conductive particles can have different shapes, such as spherical and/or flake-like shapes.

By using a combination of composite particles and electrically conductive particles in the curable composition of the present invention a low volume resistivity and a good stability of the electrical contact resistance under high temperature and moisture conditions can be achieved, even if said composition is used to bond non-noble substrates, such as electrodes which comprise or consist of aluminum.

The electrically conductive particles may be selected from metal particles, metal plated particles or metal alloy particles and/or combinations thereof, wherein the electrically conductive particles preferably comprise or essentially consist of copper, silver, platinum, palladium, gold, tin, indium, aluminum or bismuth and/or combinations thereof. Electrically conductive particles essentially consisting of silver are particularly preferred for use herein. In the present invention such particles are referred to as silver particles.

The term "essentially consist of", as used above, include electrically conductive particles which comprise non-intentionally added impurities, wherein the amount of said impurities is less than 0.2 wt.-%, preferably less than 0.1 wt.-%, and more preferably less than 0.01 wt.-%, based on the total amount of the electrically conductive particles of the present invention.

Desirably, the plated or coated metal combinations include silver coated copper, silver coated boron nitride, and/or silver coated aluminum, wherein silver-coated particles are particularly preferred for use herein.

In an alternative embodiment of the present invention, the electrically conductive particles comprise or consist of carbon black, carbon fibers, graphite or metallic coated glass spheres, such as silver coated glass and/or combinations thereof.

Preferably, the electrically conductive particles have an average particle size of about 1 μm to about 50 μm, preferably of about 3 μm to about 20 μm, and more preferably of about 4 μm to about 15 μm. The average particle size of the electrically conductive particles of the present invention is determined as described above.

The electrically conductive particles may be present in the curable composition in an amount of about 5 wt.-% to about 85 wt.-%, preferably in an amount of about 20 wt.-% to about 70 wt.-%, and more preferably in an amount of about 30 wt.-% to about 50 wt.-%, each based on the total amount of the curable composition of the present invention.

The electrically conductive particles are presently available commercially from several companies, such as Ferro Corp., Technic Inc., Ames Goldsmith Corp., Dowa Holdings Co., Ltd., Fukuda, Mitsui, and Metalor Technologies.

In the curable composition of the present invention the following different combinations of composite particles and electrically conductive particles can preferably be used:

composite particles, comprising i) an electrically conductive core, containing aluminum and ii) an electrically conductive shell, comprising one or more shell materials each selected from metal carbides; and electrically conductive silver particles;

composite particles, comprising i) an electrically conductive core, containing aluminum and ii) an electrically conductive shell, comprising a shell material selected from tungsten carbide; and electrically conductive silver particles;

composite particles, comprising i) an electrically aluminum conductive core, and ii) an electrically conductive shell consisting of tungsten carbide; and electrically conductive silver particles;

from about 20 wt.-% to about 70 wt.-% of composite particles, comprising i) an electrically conductive core, containing aluminum and ii) an electrically conductive shell, comprising one or more shell materials each selected from metal carbides; and from about 20 wt.-% to about 70 wt.-% of electrically conductive silver particles;

from about 20 wt.-% to about 70 wt.-% of composite particles, comprising i) an electrically conductive core, containing aluminum and ii) an electrically conductive shell, comprising a material selected from tungsten carbide; and from about 20 wt.-% to about 70 wt.-% of electrically conductive silver particles;

from about 20 wt.-% to about 70 wt.-% of composite particles, comprising i) an electrically conductive aluminum core, and ii) an electrically conductive shell consisting of tungsten carbide; and from about 20 wt.-% to about 70 wt.-% of electrically conductive silver particles.

If the curable resin component is selected from acrylic resins, it is preferred that the curable composition of the present invention comprises:

from about 30 wt.-% to about 50 wt.-% of composite particles, comprising i) an electrically conductive aluminum core, and ii) an electrically conductive shell consisting of tungsten carbide; and from about 30 wt.-% to about 50 wt.-% of electrically conductive silver particles.

If the curable resin component is selected from epoxy resins it is preferred that the curable composition of the present invention comprises:

from about 25 wt.-% to about 55 wt.-% of composite particles, comprising i) an electrically conductive aluminum core, and ii) an electrically conductive shell consisting of tungsten carbide; and from about 25 wt.-% to about 55 wt.-% of electrically conductive silver particles.

All amounts given above are based on the total amount of the curable composition of the present invention.

The weight ratio of the composite particles to the electrically conductive particles in the curable composition of the present invention is preferably from 10:1 to 1:10, more preferably from 5:1 to 1:5, and particularly preferably from 2:1 to 1:2.

Depending on the reactivity of the at least one resin component used in the curable composition of the present invention it might be useful to include at least one additional curing agent to initiate and/or accelerate the curing process. Epoxy resin-based curable composition of the present invention are normally cured by exposing the composition to elevated temperatures whereas acrylic resin-based curable composition can be cured by exposing said composition to elevated temperatures and/or radiation, such as UV radiation.

For acrylic resins, suitable curing agents can be selected from radical initiators, such as peroxide compounds or azo compounds, such as cumene hydroperoxide (CHP); tert-butyl peroxybenzoate (TBPB); t-butylhydroperoxide (TBH), methyl ethyl ketone peroxide; benzoyl peroxide; acetyl peroxide; 2,5-dimethylhexane-2,5-dihydroperoxide; di-tert-butyl perphthalate; dicumyl peroxide; 2,5-dimethyl-2,5-bis(tert-butylperoxide)hexane; 2,5-dimethyl-2,5-bis(tert-butylperoxy)hexyne; bis(tert-butylperoxyisopropyl)benzene; di-t-butyl peroxide; 1,1-di(tert-amylperoxy)-cyclohexane; 1,1-di-(tert-butylperoxy)-3,3,5-trimethylcyclohexane; 1,1-di-(tert-butylperoxy)-cyclohexane; 2-di-(tert-butylperoxy)butane; n-butyl-4,4-di(tert-butylperoxy)valerate; ethyl-3,3-di-(tert-amylperoxy)butyrate; ethyl-3,3-di(tert-butylperoxy)-butyrate; t-butyl peroxy-neodecanoate; di-(4-5-butyl-cyclohexyl)-peroxy-dicarbonate; lauryl peroxide; 2,5-dimethyl-2,5-bis(2-ethylhexanoyl peroxy)hexane; p-menthane hydroperoxide; diisopropylbenzene hydroperoxide; pinene hydroperoxide; t-amyl peroxy-2-ethylhexanoate 2,2'-azobis(2-methyl-propionitrile), or 2,2'-azobis(2,4-methylbutanenitrile).

For epoxy resins, suitable curing agents can be selected from nitrogen-containing curing agents, such as primary amines, secondary amines, tertiary amines, epoxy-amine adducts, epoxy imidazole adducts or anhydrides.

At least one curing agent may be present in the inventive curable composition in an amount in the range of about 0.01 to about 5 wt.-%, preferably in an amount in the range of about 0.1 to about 2.5 wt.-%, and more preferably in an amount in the range of about 0.2 to about 2 wt.-%, based on the total amount of the inventive adhesive.

The curing agents may promote curing at a temperature of 0° C. to 200° C., preferably at 50° C. to 150° C. Typical curing times are in the range of 5 min to 2 hours, more preferably in the range of 10 min to 1 hour. It is particularly preferred to thermally cure the curable composition of the present invention by exposing said composition to a temperature of 50° C. to 150° C. for 10 min to 1 hour.

The curable composition of the present invention may further comprises one or more additives, such as initiators, plasticizers, oils, stabilizers, antioxidants, anti-corrosion agents, chelating agents, pigments, dyestuffs, polymeric additives, defoamers, preservatives, thickeners, rheology modifiers, humectants, adhesion promoters, dispersing agents, anti-bleed agents and water.

When used, additives are used in an amount sufficient to provide the desired properties. At least one additive may be present in the inventive curable composition in an amount in the range of about 0.05 wt.-% to about 10 wt.-%, preferably in an amount in the range of about 1 wt.-% to about 5 wt.-%, and more preferably in an amount in the range of about 2 wt.-% to about 4 wt.-%, based on the total weight of the inventive adhesive. Of course, combinations of different additives are also desirable for use herein.

One typical formulation of the inventive curable composition preferably comprises:

a) one or more curable resins;
b) composite particles, comprising
   i) an electrically conductive core,
   ii) an electrically conductive shell, comprising one or more shell materials each selected from the group consisting of metal carbides, metal sulfides, metal borides, metal silicides, and metal nitrides;
c) electrically conductive particles different from component b);
d) one or more curing agents; and
e) one or more additives.

More preferably said curable composition consists of:
a) one or more curable resins;
b) composite particles, comprising
   i) an electrically conductive core,
   ii) an electrically conductive shell, comprising one or more shell materials each selected from the group consisting of metal carbides, metal sulfides, metal borides, metal silicides, and metal nitrides;
c) electrically conductive particles different from component b);
d) one or more curing agents; and
e) one or more additives.

Another typical formulation of the inventive curable composition preferably comprises:
a) one or more curable resins selected from acrylic resins and/or epoxy resins;
b) composite particles, comprising
   i) an electrically conductive core,
   ii) an electrically conductive shell, comprising one or more shell materials each selected from the group consisting of metal carbides, metal sulfides, metal borides, metal silicides, and metal nitrides;
c) electrically conductive particles different from component b);
d) optionally one or more curing agents; and
e) optionally one or more additives.

More preferably said curable composition consists of:
a) one or more curable resins selected from acrylic resins and/or epoxy resins;
b) composite particles, comprising
   i) an electrically conductive core,
   ii) an electrically conductive shell, comprising one or more shell materials each selected from the group consisting of metal carbides, metal sulfides, metal borides, metal silicides, and metal nitrides;
c) electrically conductive particles different from component b);
d) optionally one or more curing agents; and
e) optionally one or more additives.

Another typical formulation of the inventive curable composition preferably comprises:
a) one or more curable resins, comprising at least at least one phosphorous-containing acrylic resin;
b) composite particles, comprising
   i) an electrically conductive core,
   ii) an electrically conductive shell, comprising one or more shell materials each selected from the group consisting of metal carbides, metal sulfides, metal borides, metal silicides, and metal nitrides;
c) electrically conductive particles different from component b);
d) one or more curing agents; and
e) one or more additives.

More preferably said curable composition consists of:
a) one or more curable resins, comprising at least at least one phosphorous-containing acrylic resin;
b) composite particles, comprising
   i) an electrically conductive core,
   ii) an electrically conductive shell, comprising one or more shell materials each selected from the group consisting of metal carbides, metal sulfides, metal borides, metal silicides, and metal nitrides;
c) electrically conductive particles different from component b);
d) one or more curing agents; and
e) one or more additives.

A further typical formulation of the inventive curable composition comprises, based on the total amount of the curable composition:
a) from about 4 to about 20 wt.-% of curable resin(s) selected from acrylic resins and/or epoxy resins;
b) from about 20 wt.-% to about 70 wt.-% of composite particles, comprising
   i) an electrically conductive core,
   ii) an electrically conductive shell, comprising one or more shell materials each selected from the group consisting of metal carbides, metal sulfides, metal borides, metal silicides, and/or metal nitrides;
c) from about 20 wt.-% to about 70 wt.-% of electrically conductive particles different from component b);
d) optionally one or more curing agents; and
e) optionally one or more additives.

More preferably said curable composition consists of, based on the total amount of the curable composition:
a) from about 4 to about 20 wt.-% of curable resin(s) selected from acrylic resins and/or epoxy resins;
b) from about 20 wt.-% to about 70 wt.-% of composite particles, comprising
   i) an electrically conductive core,
   ii) an electrically conductive shell, comprising one or more shell materials each selected from the group consisting of metal carbides, metal sulfides, metal borides, metal silicides, and/or metal nitrides;
c) from about 20 wt.-% to about 70 wt.-% of electrically conductive particles different from component b);
d) optionally one or more curing agents; and
e) optionally one or more additives.

A further typical formulation of the inventive curable composition preferably comprises, based on the total amount of the curable composition:
a) from about 4 to about 20 wt.-% of curable resin(s) selected from acrylic resins;
b) from about 30 wt.-% to about 50 wt.-% of composite particles, comprising
   i) an electrically conductive core,
   ii) an electrically conductive shell, comprising one or more shell materials each selected from metal carbides;
c) from about 30 wt.-% to about 50 wt.-% of electrically conductive particles different from component b), which are selected from silver particles;
d) optionally one or more curing agents; and
e) optionally one or more additives.

More preferably said curable composition consists of, based on the total amount of the curable composition:
a) from about 4 to about 20 wt.-% of curable resin(s) selected from acrylic resins;
b) from about 30 wt.-% to about 50 wt.-% of composite particles, comprising
   i) an electrically conductive core,
   ii) an electrically conductive shell, comprising one or more shell materials each selected from metal carbides;

c) from about 30 wt.-% to about 50 wt.-% of electrically conductive particles different from component b), which are selected from silver particles;
d) optionally one or more curing agents; and
e) optionally one or more additives.

A further typical formulation of the inventive curable composition preferably comprises, based on the total amount of the curable composition:
a) from about 4 to about 20 wt.-% of curable resin(s) selected from epoxy resins;
b) from about 30 wt.-% to about 50 wt.-% of composite particles, comprising
  i) an electrically conductive core,
  ii) an electrically conductive shell, comprising one or more shell materials each selected from metal carbides;
c) from about 25 wt.-% to about 55 wt.-% of electrically conductive particles different from component b), which are selected from silver particles;
d) optionally one or more curing agents; and
e) optionally one or more additives.

More preferably said curable composition consists of, based on the total amount of the curable composition:
a) from about 4 to about 20 wt.-% of curable resin(s) selected from epoxy resins;
b) from about 30 wt.-% to about 50 wt.-% of composite particles, comprising
  i) an electrically conductive core,
  ii) an electrically conductive shell, comprising one or more shell materials each selected from metal carbides;
c) from about 25 wt.-% to about 55 wt.-% of electrically conductive particles different from component b), which are selected from silver particles;
d) optionally one or more curing agents; and
e) optionally one or more additives As mentioned above, it is preferred that the curable composition of the present invention is free or substantially free of corrosion inhibitors. The term "substantially free of corrosion inhibitors", as used herein, means that the curable composition of the present invention comprises less than 0.5 wt.-%, preferably less than 0.1 wt.-% and more preferable less than 0.01 wt.-% of corrosion inhibitors, based on the total weight of the curable composition of the present invention.

The curable composition of the present invention is preferably an electrically conductive adhesive, which can find use in the fabrication of a broad variety of electronic devices, for example in the fabrication of integrated circuits, semiconductor devices, solar cells and/or solar modules.

It is a particular advantage of the curable composition of the present invention that said composition can be used to form stable electrically conductive bonds between metallic electrodes, wherein at least one of the electrodes can comprise or consist of a non-noble material, such as aluminum. In this context the curable composition of the present invention can be used to reduce the amount of expensive noble metals, such as silver, in electronic devices by fully or partly replacing the noble metal with inexpensive non-noble metals, such as aluminum. As an example, the curable composition of the present invention can be used to directly connect the contact tabs of a c-Si solar module to the aluminum back side of the cell without using a conventional silver-containing busbar or path. In a further application, the curable composition can be used to replace expensive copper-containing conductors with aluminum-containing conductors in back contact solar modules. Examples of suitable back contact solar modules can be found in U.S. patent application No. 2008/0216887 A1.

When cured, the cured product of the curable composition of the present invention forms a stable electrical conductive interconnection between two surfaces, wherein said interconnection provides a low and stable contact resistance, even when this interconnection is exposed to harsh environmental conditions, such as heat and/or moisture.

A further aspect of the present invention is the cured product of the curable composition. The curable composition of the present can preferably be cured by exposing the curable composition to appropriate conditions, such as heat or UV-radiation. It is particular preferable that the curable composition of the present invention is thermally cured by exposing it to elevated temperatures.

Another aspect of the present invention is a bonded assembly comprising a first and a second substrate aligned in a spaced apart relationship, each of which having an inwardly facing surface and an outwardly facing surface, wherein between the inwardly facing surfaces of each of the two substrates an electrically conductive bond is formed by the cured product of the curable composition of the present invention.

A further aspect of the present invention relates to a method of bonding a first substrate to a second substrate, comprising the steps of:
a) providing the curable composition of the present invention;
b) applying the curable composition to the first and/or second substrate;
c) bringing the substrates together with the curable composition between them; and
d) applying pressure to the first and/or second substrate at a temperature sufficient to cure the curable composition to thereby bond the first substrate to the second substrate.

The pressure in step d) of the method of the present invention may be applied by using a pressure exerting device. The pressure exerting device can be selected from any suitable device which is capable of applying pressure to the first and/or second substrate at a temperature sufficient to cure the curable composition of the present invention. In one embodiment the pressure exerting device comprises a heating unit which is capable of heating at least one part of the pressure exerting device to a temperature sufficient to cure the curable composition of the present invention, for example to a temperature of 100° C. to 250° C. Suitable pressure exerting devices include thermode devices suitable for joining electrical components, wherein such thermode devices may comprise a basic member and one or more heatable head units and said one or more heatable head and the first and/or second substrate can be moved relatively to each other. The heatable head unit is preferably used for pressing the first substrate to the second substrate while heat is transferred from the heatable head unit to the first and/or second substrate.

Other suitable pressure exerting devices include rollers, plates, pistons and/or stamps, wherein at least one part of the aforementioned pressure exerting devices is preferably heatable to a temperature sufficient to cure the curable composition of the present invention.

To further improve the efficiency of the bonding operation an additional vacuum may be applied between the first and the second substrate in step d) of the method of the present invention.

By choosing the correct heating and pressing conditions the electrical contact resistance of the formed bond between the first and the second substrate can be adapted to specific requirements of different applications. By applying a pressure of greater than or equal to 100 Pa, preferably of greater than or equal to 1000 Pa, to the first and/or second substrate in the pressure applying step d) of the method of the present invention an electrical contact or bond can be formed between said substrates which exhibits a particularly low electrical contact resistance in combination with a good electrical stability even at high temperatures.

The term "substrate", as used herein, preferably refers to an electrode, wherein the inwardly facing surface of the electrode is in contact with the cured product of the curable composition of the present invention.

In a preferred embodiment the first and/or second substrate is a metallic substrate which comprises a surface oxide layer. More preferably the first and/or second substrate comprises or essentially consists of aluminum, wherein the aluminum substrate may exhibit a surface oxide layer.

The term "essentially consists of aluminum" as used herein refers to a substrate, such as a metallic electrode, which comprises at least 90 wt.-%, more preferably at least 95 wt.-%, particularly preferably at least 99 wt.-%, and more particularly preferably at least 99.9 wt.-% of aluminum or aluminum oxide, each based on the total amount of the substrate.

EXAMPLES

Different adhesives according to the invention and comparative formulations were made by using the following components:

| Resin components | |
|---|---|
| Acrylic resin 1 | Isobornyl acrylate-hydrophobic acrylic resin |
| Acrylic resin 2 | Hydroxypropyl methacrylate |
| Acrylic resin 3 | SR834-Tricyclodecanedimethanol dimethacrylate from Sartomer |
| Acrylic resin 4 | UC-102-hydrophobic acrylic resin from Kuraray Co., Ltd. |
| P-acrylic resin | SR 9051-phosphor-containing acrylic resin from Sartomer |
| Epoxy masterbatch (MB) | Epoxy masterbatch based on Bisphenol F epoxy resin |
| Curing agents | |
| Peroxide 1 | Luperox 10-Peroxyester from Arkema Inc. |
| Imidazole hardener | 2-phenyl-4-methyl imidazole |
| Carboxamide hardener | 4-methyl-1,3-phenylene-bis-1-pyrrolidinecarboxamide |
| Composite particles | |
| WC/Al particles | GF 45-Tungsten carbide coated aluminum particles from Potters Industries, Inc. |
| Electrically conductive particles | |
| Ag particles 1 | GA 23811-Silver flakes from Metalor Technologies |
| Ag particles 2 | EA23826-Silver flakes from Metalor Tech. |
| Ag particles 3 | SA0201-Silver flakes from Metalor Tech. |
| Ag particles 4 | EA0001-Silver flakes from Metalor Tech. |
| In particles | S 635-Indium fine powder from AM&M |

The curable compositions of the present invention and comparative formulations were prepared by simply mixing the aforementioned components.

The quantities of each component of the inventive and comparative formulations are given in Table 1 to 3 in parts by weight.

The cured products of the adhesive formulations were characterized by using the following analytical methods:

Volume Resistivity

The volume resistivity was determined in the following manner: aliquots of the prepared formulations were drawn down the surface of glass slides giving strips with strip dimensions of 5 cm length, 5 mm width and approximately 50 micron thickness. The samples were cured by placing them on a pre-heated hotplate (150° C.) for an appropriate period of time.

After curing the strips were approximately 0.005 to 0.03 cm thick. Resistance was determined by measuring the voltage (V) drop along a 5 cm strip while passing current (I) through the strip, (R=V/I). Three separate strips were prepared and measured for resistance and dimensions. The volume resistivity (Rv) was calculated for each strip using the formula Rv=(R(w)(t)/L) where R is the electrical resistance of the sample in ohms measured using an ohmmeter or equivalent resistance measuring device, w and t are the width and thickness of the sample, in centimeters, and L is the distance in centimeters between the electrical conductors of the resistance measuring device. Volume resistivity units are reported in Ohm·cm.

Electrical Contact Resistance

The electrical contact resistance was determined (TLM structure test setup) by attaching silver coated copper contact tabs to the aluminum firing paste on the back a c-Si solar cell. A TLM structure was obtained by contacting 7 contact tabs to the test layer, wherein the contact tabs exhibit increasing distances between the contact tabs going from about 3 mm to about 18 mm. The resistance between the neighbouring contact tabs was measured by a Keithley 2010 multimeter and plotted as a function of the distance. The contact resistance value is the half of the intercept from the curve obtained from that plot. The average contact resistance (arithmetic average) is reported in Ohm.

The stability of the electrical contact resistance was determined by accelerated aging testing (85° C., relative humidity of 85%) using the TLM test setup as described above.

Table 2 and 3 also denote the properties of the (cured) formulations. The electrically conducting properties of the cured products of the inventive formulations and the cured products of the comparative formulations were evaluated by determining the volume resistivity and the stability of the contact resistance.

TABLE 1

| Acrylate-based formulations | | | | | | |
|---|---|---|---|---|---|---|
| | 1 | 2[a] | 3 | 4 | 5 | 6[a] |
| Acrylic resin 1 | 6.54 | 6.54 | 6.85 | 7.22 | 6.54 | 6.54 |
| Acrylic resin 2 | 0.48 | 0.48 | 0.50 | 0.53 | 0.48 | 0.48 |
| Acrylic resin 3 | 2.84 | 2.84 | 2.98 | 3.14 | 2.84 | 2.84 |
| Acrylic resin 4 | 7.58 | 7.58 | 7.93 | 8.37 | 7.58 | 7.58 |
| P-acrylic resin | 0.95 | 0.95 | 1.00 | — | 0.95 | 0.95 |

TABLE 1-continued

| Acrylate-based formulations | | | | | | |
|---|---|---|---|---|---|---|
| | 1 | 2[a] | 3 | 4 | 5 | 6[a] |
| Peroxide 1 | 0.40 | 0.40 | 0.42 | 0.42 | 0.40 | 0.40 |
| WC/Al particles | 40.35 | — | 42.27 | 42.27 | 56.53 | 76.71 |
| Ag particles 1 | 36.32 | 76.67 | 38.05 | 38.05 | 20.18 | — |
| VR [Ohm · cm] | 6.1E−03 | 3.3E−04 | 8.4E−03 | n.d. | 3.3E+02 | 4.1E+02 |
| CR [Ohm] | | | | | | |
| Initial | 0.054 | 0.079 | 0.075 | 0.124 | 0.189 | 0.208 |
| After 24 h @ 85° C/85% RH | — | — | — | — | 4.850 | 3.155 |
| After 48 h @ 85° C/85% RH | — | — | — | — | 15.885 | 47.007 |
| After 100 h @ 85° C/85% RH | — | — | 0.148 | 5.534 | — | — |
| After 120 h @ 85° C/85% RH | — | — | — | — | 324.451 | 555.126 |
| After 425 h @ 85° C/85% RH | 0.071 | 6.51 | — | — | — | — |
| After 500 h @ 85° C./85% RH | — | — | 0.206 | 61.745 | — | — |
| After 815 h @ 85° C/85% RH | 0.147 | 661 | — | — | — | — |
| After 1250 h @ 85° C/85% RH | 0.260 | — | — | — | — | — |

[a]Comparative example

TABLE 2

| Acrylate-based formulations | | | | | | |
|---|---|---|---|---|---|---|
| | 7 | 8 | 9 | 10 | 11 | 12 |
| Acrylic resin 1 | 7.00 | 7.00 | 7.00 | 7.00 | 7.00 | 7.00 |
| Acrylic resin 2 | 0.50 | 0.50 | 0.50 | 0.50 | 0.50 | 0.50 |
| Acrylic resin 3 | 3.00 | 3.00 | 3.00 | 3.00 | 3.00 | 3.00 |
| Acrylic resin 4 | 8.1 | 8.1 | 8.1 | 8.1 | 8.1 | 8.1 |
| P-acrylic resin | 1.00 | 1.00 | 1.00 | 1.00 | 1.00 | 1.00 |
| Peroxide 1 | 0.40 | 0.40 | 0.40 | 0.40 | 0.40 | 0.40 |
| WC/Al particles | 5 | 10 | 15 | 30 | 35 | 40 |
| Ag particles 1 | 30 | 28 | 26 | 20 | 18 | 16 |
| Ag particles 2 | 45 | 42 | 39 | 30 | 27 | 24 |
| VR [Ohm · cm] | 1.6E−03 | 2.0E−03 | 2.4E−03 | 2.4E−02 | 4.1E−02 | n.d. |
| CR [Ohm] | | | | | | |
| Initial | 0.016 | 0.021 | 0.012 | 0.013 | 0.021 | 0.015 |
| After 480 h @ 85° C/85% RH | 0.222 | 0.273 | 0.162 | 0.126 | 0.142 | 0.104 |
| After 648 h @ 85° C/85% RH | 0.294 | 0.340 | 0.206 | 0.167 | 0.198 | 0.136 |
| After 840 h @ 85° C/85% RH | 0.365 | 0.421 | 0.257 | 0.212 | 0.260 | 0.171 |
| After 1032 h @ 85° C/85% RH | 0.422 | 0.497 | 0.305 | 0.257 | 0.321 | 0.199 |
| After 1200 h @ 85° C/85% RH | 0.479 | 0.588 | 0.355 | 0.308 | 0.388 | 0.240 |

TABLE 3

| Epoxy-based formulations | | | | | | |
|---|---|---|---|---|---|---|
| | 13 | 14 | 15 | 16 | 17 | 18[a] |
| Epoxy MB | 4.09 | 4.09 | 4.09 | 4.09 | 2.85 | 2.85 |
| Ag particles 3 | 4.00 | 5.14 | 5.71 | 2.00 | 5.50 | — |
| Ag particles 4 | 4.00 | 5.14 | 5.71 | 2.00 | 5.50 | — |
| In particles | 0.96 | 0.96 | 0.96 | 0.96 | 0.96 | 0.96 |
| Imidazole hardener | 0.016 | 0.016 | 0.016 | 0.016 | 0.02 | 0.02 |
| Carboxamide hardener | 0.117 | 0.117 | 0.117 | 0.117 | 0.17 | 0.17 |
| WC/Al particles | 6.82 | 4.55 | 3.41 | 10.82 | 5.00 | 11.56 |
| CR [Ohm] | | | | | | |
| Initial | 0.018 | 0.010 | 0.011 | 0.084 | 0.031 | 1.813 |
| After 24 h @ 85° C/85% RH | — | — | — | — | 0.161 | 121.338 |
| After 43 h @ 85° C/85% RH | — | — | — | 0.563 | — | — |
| After 48 h @ 85° C/85% RH | — | — | — | — | 0.281 | 874.671 |
| After 120 h @ 85° C/85% RH | — | — | — | — | 0.853 | 2681.945 |
| After 139 h @ 85° C/85% RH | — | — | — | 2.528 | — | — |

TABLE 3-continued

| Epoxy-based formulations | | | | | | |
|---|---|---|---|---|---|---|
| | 13 | 14 | 15 | 16 | 17 | 18[a] |
| After 376 h @ 85° C/85% RH | 0.891 | 0.387 | 0.372 | — | — | — |
| After 424 h @ 85° C/85% RH | 1.155 | 0.476 | 0.419 | — | — | — |
| After 520 h @ 85° C/85% RH | 4.517 | 0.854 | 0.600 | — | — | — |
| After 592 h @ 85° C/85% RH | n.d. | 1.066 | 0.980 | — | — | — |
| After 1078 h @ 85° C/85% RH | | 2.962 | n.d. | — | — | — |

[a]Comparative example

In Table 1 the volume resistivity and contact resistance (CR) of the cured products of different acrylate-based formulations is shown. The comparison of example 1 vs. 2 and 5 vs. 6 demonstrates that a stable contact resistance under harsh conditions was only obtained if the formulation contained the combination of composite particles (e.g. WC/Al particles) and electrically conductive particles (e.g. silver particles).

In addition it was found, that the stability of the contact resistance was further improved by using an acrylate-based formulation which contained the combination of a monofunctional and a phosphorous-containing acrylic resin (example 3 vs. 4).

Table 2 demonstrates that a particular good stability of the contact resistance was achieved, when the amount of composite particles and electrically conductive particles was about 40 wt.-% each (example 12).

Table 3 denotes the contact resistance (CR) of the cured products of different epoxy-based formulations. In examples 13 to 17 a good stability of the contact resistance was observed wherein said formulations all contained a combination of composite particles (e.g. WC/Al particles) and electrically conductive particles (e.g. silver particles). The stability of the contact resistance deteriorated when no composite particles were present in the formulation (see example 18).

The invention claimed is:

1. A curable composition, comprising:
 a) one or more curable resins;
 b) composite particles, consisting of
  i) an electrically conductive core consisting of aluminum and an aluminum oxide layer surrounding the core, and
  ii) an electrically conductive shell consisting of one or more shell materials each selected from the group consisting of metal carbides, metal sulfides, metal borides, metal silicides, and metal nitrides;
 c) electrically conductive particles consisting essentially of silver particles,
 wherein the shell and the core material are conductively fused directly together through the oxide layer,
 wherein the composition is electrically conductive, and
 wherein the composite particles are in an amount of about 5 to about 85 wt.-%, based on the total amount of the curable composition.

2. The curable composition according to claim 1, wherein the curable resin is selected from epoxy resins, phenoxy resins, benzoxazine resins, acrylic resins, maleimide resins, cyanate ester resins, phenolic resins, silicone resins, and/or combinations thereof.

3. The curable composition according to claim 1, wherein the one or more curable resins are selected from acrylic resins.

4. The curable composition according to claim 3, wherein at least one curable resin is an acrylic resin comprising one or more polymerizable acryloyl groups and at least one phosphor atom that can be partially hydrolyzed.

5. The curable composition according to claim 1, wherein the one or more curable resins are selected from epoxy resins.

6. The curable composition according to claim 1, wherein the curable composition comprises the curable resin(s) in a total amount of about 2 to about 40 wt.-%, based on the total amount of the curable composition.

7. The curable composition according to claim 1, wherein the shell material is a metal carbide selected from tungsten carbide, niobium carbide, titanium carbide, vanadium carbide, molybdenum carbide, zirconium carbide or boron carbide.

8. The curable composition according to claim 1, wherein the curable composition comprises the composite particles in an amount of at least 20 wt.-%, based on the total amount of the curable composition.

9. The curable composition according to claim 1, wherein said curable composition is substantially free of corrosion inhibitors.

10. The curable composition according to claim 1, wherein said curable composition is an electrically conductive adhesive.

11. A cured product of the curable composition according to claim 1.

12. A method of bonding a first substrate to a second substrate, comprising the steps of:
 a) providing the curable composition according to claim 1;
 b) applying the curable composition to the first and/or second substrate;
 c) bringing the substrates together with the curable composition between them; and
 d) applying pressure to the first and/or second substrate at a temperature sufficient to cure the curable composition to thereby bond the first substrate to the second substrate.

13. The method of claim 12, wherein a pressure of greater than or equal to 100 Pa is applied to the first and/or second substrate in the pressure applying step d).

14. The method according to claim 12, wherein the first and/or second substrate is an aluminum substrate, which exhibits an aluminum oxide surface layer.

15. An electrically conductive adhesive for bonding a non-noble substrate, comprising:
 a) one or more curable resins;
 b) composite particles, consisting of
  i) an electrically conductive core consisting of aluminum and an aluminum oxide layer surrounding the aluminum, and
  ii) an electrically conductive shell consisting of one or more shell materials each selected from the group consisting of metal carbides, metal sulfides, metal borides, metal silicides, and metal nitrides;
 wherein the shell and the core material are conductively fused directly together through the oxide layer,
 wherein the composite particles comprises 5 to about 85 wt.-%, based on the total amount of the curable composition, and
 c) electrically conductive particles essentially consisting of silver particles.

16. An bonded substrate comprising an electrically conductive adhesive bonded to a non-noble substrate wherein the electrically conductive adhesive comprises:
   a) one or more curable resins;
   b) composite particles, consisting of
      i) an electrically conductive core consisting of aluminum and an aluminum oxide layer surrounding the aluminum, and
      ii) an electrically conductive shell consisting of one or more shell materials each selected from the group consisting of metal carbides, metal sulfides, metal borides, metal silicides, and metal nitrides;
      wherein the shell and the core material are conductively fused directly together through the oxide layer,
      wherein the composite particles comprises 5 to about 85 wt.-%, based on the total amount of the curable composition; and
   c) electrically conductive particles essentially consisting of silver particles.

17. The curable composition according to claim 3, wherein at least one curable resin is selected from the group consisting of phosphate monoesters of hydroxyalkyl(meth)acrylates, phosphate diesters of hydroxyalkyl (meth)acrylates, phosphate triesters of hydroxyalkyl(meth)acrylates and mixtures thereof.

* * * * *

UNITED STATES PATENT AND TRADEMARK OFFICE
CERTIFICATE OF CORRECTION

PATENT NO. : 9,914,855 B2
APPLICATION NO. : 14/620576
DATED : March 13, 2018
INVENTOR(S) : Anja Henckens and Nabila Idrissi It is certified that error appears in the above-identified patent and that said Letters Patent is hereby corrected as shown below:

In the Specification

Column 4, Lines 62-63 change "Albifelx 296" to -- Albiflex 296 --.
Column 6, Line 31 change "theses" to -- these --.
Column 11, Line 53 change "comprising at least at least" to -- comprising at least --.
Column 11, Line 66 change "comprising at least at least" to -- comprising at least --.

Signed and Sealed this
Twenty-fifth Day of June, 2019

Andrei Iancu
*Director of the United States Patent and Trademark Office*